United States Patent
Tired

(10) Patent No.: US 8,149,955 B2
(45) Date of Patent: Apr. 3, 2012

(54) SINGLE ENDED MULTIBAND FEEDBACK LINEARIZED RF AMPLIFIER AND MIXER WITH DC-OFFSET AND IM2 SUPPRESSION FEEDBACK LOOP

(75) Inventor: Tobias Tired, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 719 days.

(21) Appl. No.: 12/164,142

(22) Filed: Jun. 30, 2008

(65) Prior Publication Data

US 2009/0323864 A1 Dec. 31, 2009

(51) Int. Cl.
- H04L 25/06 (2006.01)
- H04B 1/26 (2006.01)
- H03L 5/00 (2006.01)
- H03F 3/45 (2006.01)

(52) U.S. Cl. ........ 375/318; 375/345; 375/346; 375/317; 375/319; 455/295; 455/324; 455/326; 327/355; 327/356; 327/357; 327/358; 327/307; 330/9; 330/227; 330/252; 330/253; 330/259

(58) Field of Classification Search .......... 375/345–346, 375/317–319; 455/295, 324, 326; 327/307, 327/355–359; 330/9, 252–253, 259, 260, 330/227, 290, 310

See application file for complete search history.

(56) References Cited

U.S. PATENT DOCUMENTS

| | | | | |
|---|---|---|---|---|
| 6,670,901 | B2 * | 12/2003 | Brueske et al. | 341/139 |
| 7,203,472 | B2 * | 4/2007 | Seppinen et al. | 455/226.1 |
| 7,474,149 | B2 * | 1/2009 | Snelgrove et al. | 330/136 |
| 2002/0044020 | A1 | 4/2002 | Umeda et al. | |
| 2002/0126767 | A1 | 9/2002 | Ding et al. | |
| 2003/0007377 | A1 | 1/2003 | Otaka | |
| 2004/0145415 | A1 * | 7/2004 | Sun | 330/295 |
| 2004/0176055 | A1 | 9/2004 | Vepsalainen et al. | |

OTHER PUBLICATIONS

PCT International Search Report, mailed Sep. 25, 2009, in connection with International Application No. PCT/EP2009/057789.
PCT Written Opinion, mailed Sep. 25, 2009, in connection with International Application No. PCT/EP2009/057789.
Chen, C-P. et al. "Low-Power Fully Integrated and Tunable CMOS RF Wireless Receiver for ISM Band Consumer Applications" IEEE Transactions on Circuits and Systems Part I: Regular Papers, IEEE Service Center, New York, NY, US, vol. 52, No. 9, Sep. 1, 2005, pp. 1758-1766, XP011139051, ISSN: 1057-7122.

\* cited by examiner

*Primary Examiner* — Khanh C Tran
*Assistant Examiner* — Janice Tieu
(74) *Attorney, Agent, or Firm* — Potomac Patent Group PLLC

(57) ABSTRACT

A receiver arrangement includes a single ended multiband feedback amplifier, at least one single ended input, differential output mixer arrangement including a main mixer and a trim mixer, and a mixer feedback loop circuit configured to receive differential output signals generated by the mixer arrangement. The mixer feedback loop circuit generates a feedback signal based on the received differential output signals and provides the feedback signal to the mixer arrangement to minimize DC-offset and second order intermodulation products. The single ended multiband feedback amplifier may include an input stage and a programmable resonance tank circuit connected to the input stage for suppressing downconverted noise from harmonics of the LO-frequency, and a configurable feedback net that shapes the frequency response of a feedback loop including the feedback net based on a band operation of the single ended multiband feedback amplifier.

14 Claims, 9 Drawing Sheets

ID MULTIBAND FEEDBACK LINEARIZED RF AMPLIFIER AND MIXER WITH DC-OFFSET AND IM2 SUPPRESSION FEEDBACK LOOP

SINGLE ENDED MULTIBAND FEEDBACK LINEARIZED RF AMPLIFIER AND MIXER WITH DC-OFFSET AND IM2 SUPPRESSION FEEDBACK LOOP

FIELD OF THE INVENTION

The invention relates to feedback methods and systems, and more particularly, to utilizing signal feedback in communications device receivers to limit DC-Offset and intermodulation distortion.

BACKGROUND

Conventional wideband code division multiple access (WCDMA) low noise amplifier (LNA) and mixer architectures have an external surface acoustical wave (SAW) filter between the LNA and mixer. The purpose of the SAW-filter is to attenuate the transmit (TX)-signal that leaks into the LNA through the finite isolation of the duplexer.

FIG. 1 shows typical architecture included in a mobile station, such as a WCDMA handset. The architecture includes a transmitter 4 (TX) having an output connected to a power amplifier (PA) 5, which amplifies the transmit signal output. The output of the PA 5 is connected to the duplexer 6. Also connected to the duplexer 6 is a receiver 7 (RX) and antenna 8. The receiver 7 includes on-chip components 9 as well as off-chip components. While direct conversion architecture provides a way to integrate many components of the receiver 7, such as the low noise amplifier 12, in-phase (I) mixer 14, quadrature (Q) mixer 16, local oscillator (LO) 18, phase shifter 19, baseband channel filters including a low pass filter 20 for the I signal and a low pass filter 22 for the Q signal, and variable gain amplifiers (VGAs), the SAW-filter is an off-chip component. In FIG. 1, the SAW-filter is depicted as band pass filter (BPF) 10.

The duplexer 6 typically provides some 50-55 dB isolation from TX to (receive) RX. However, additional isolation is normally needed to prevent the TX-leakage from deteriorating the receiver's performance. The receiver is degraded through intermodulation generated by second and third order distortion. For a circuit supporting multiband WCDMA, the solution with the SAW-filter 10 between the LNA 12 and mixers 14 and 16 becomes troublesome because each supported band would need its own SAW-filter. However, such a solution would be unattractive because it would add cost and printed circuit board (PCB) area.

There are several possible combinations of single ended/differential LNA and mixers that could be used in a SAW-less architecture:

Differential LNA and differential mixer: The drawback is the additional package pin for the LNA. A multiband circuit will need a larger package.

Single ended LNA and differential mixer. The drawback is the large on-chip balun needed between the LNA and mixer. If several baluns are needed in a multiband solution, the area penalty is increased.

Single ended LNA and single ended mixer. In an all single ended solution, there is no need for an on-chip balun.

In conventional architectures with a SAW filter present between the LNA and mixer, the SAW filter can have a single ended input and a differential output. The LNA can then be designed with a single ended input and a single ended output connected to the SAW filter. If the SAW filter output is differential, the mixer can be designed as double balanced, i.e., with differential RF input and differential LO input. An alternative architecture may include a SAW filter with both single ended input and output in combination with an on-chip balun to create the differential RF signal.

A WCDMA LNA and mixer are prone to second order intermodulation distortion (IM2) and third order intermodulation distortion (IM3). The IM3 product that the interstage SAW filter helps against is the one that is generated in the mixer transconductance stage and in the switching mixer core. For WCDMA, the worst intermodulation case is when an interferer is present at half the duplex distance between the RX and TX frequency. The third order nonlinearity of the LNA and mixer will create a spurious signal at the RX frequency originating from the TX-leakage into the LNA and the interferer at half the duplex distance, which is illustrated as path 30 in FIG. 1. The SAW filter attenuates the TX-signal and the out of band blocking signals and therefore also the intermodulation product that is generated from these signals. Example: WCDMA band I with Duplex Distance 190 MHz $f_{RX}$=2140 MHz
$f_{TX}$=2140 MHz−190 MHz=1950 MHz
$f_{1/2\text{-}duplex\text{-}interferer}$=2045 MHz
$f_{IM3}$=2·2045 MHz−1950 MHz=2140 MHz=$f_{RX}$ The LNA and mixer IM2 arises when two interferers at $f_1$ and $f_2$ imputted into a mixer with a second order nonlinearity generate an intermodulation product at their difference frequency $f_1-f_2$. This intermodulation product will fall directly into the wanted downconverted baseband frequency band if the interferers are close to each other. In a WCDMA receiver, the worst-case interferer for the mixer second order nonlinearity is the TX-signal that leaks into the receive path through the finite TX-RX isolation of the duplexer. The TX-signal is a WCDMA digitally modulated interferer with AM- and FM modulation. The AM-modulation can be represented by a two-tone interferer with two close frequencies at $f_1$ and $f_2$. The second order nonlinearity of the mixer will translate a squared version of the envelope of the TX-signal to the receiver mixer output. This is the scenario that defines the second order intercept point ($IP_2$) requirement for the LNA and mixer. The receiver IM2 level due to TX-leakage is tested in a 3GPP standard test case that specifies the minimum required sensitivity for bit error rate (BER) <$10^{-3}$ while the transmitted signal is at maximum power level (+24 dBm) at the antenna.

There are three mechanisms that generate second order distortion in a zero-IF receiver: RF self-mixing, second order nonlinearity in the mixer transconductance stage, and cross modulation of the LO-leakage.

RF self mixing occurs when the RF signal leaks to the LO-signal in the mixer through parasitic coupling in the mixer core switching devices. This leakage is illustrated as path 32 in FIG. 1. If the LO-amplitude is not high enough the mixer behaves more like a linear multiplier and consequently the mixer output will contain a signal that is proportional to the square of the input signal i.e. an $IM_2$ product. If the RF signal is the TX-leakage with AM-modulation, a low baseband frequency IM2 product will be generated through self-mixing in the switching mixer core transistors. However, if the LO-amplitude is high enough this effect is significantly reduced.

A second order nonlinearity also exists in the transconductance transistors that generate the RF-current supplied to the mixer core switching transistors. An AM-modulated interferer represented by two frequencies, $f_1$ and $f_2$, will generate a low frequency second order intermodulation product at $f_1-f_2$ that is added to the wanted output current from the transconductance transistor. If the mixer is perfectly balanced, i.e. there is no mismatch in the switching core transistors, the mixer load resistor, or the LO driver block, the low frequency intermodulation product at $f_1-f_2$ will not reach the mixer output. In reality, a mismatch inevitably exists in these components. As a result, this intermodulation product leaks to the mixer output.

In a double balanced mixer, the mixer transconductor is a differential stage with built-in suppression of the even order IM2 products. The amount of suppression is dependent on the matching of the devices in both the transconductance stage and the mixer switching core. A solution with a single ended mixer relies on the matching in the mixer switching core only for suppressing IM2 originating from the transconductance stage.

Cross modulation of the LO-leakage is a mechanism through which the AM-modulation of the TX-leakage interferer at the mixer core RF input transfers to the LO-leakage at the mixer RF input. Downconversion of this AM-modulated LO-leakage with the LO-signal itself will generate a mixer output signal at the IM2-frequency. Compared with the IM2 products generated by self-mixing and second order nonlinearity in the mixer transconductance stage, the cross modulation product is a differential signal, i.e., the phase of the IM2 product at the two mixer outputs differ by 180 degrees.

SUMMARY

Embodiments in accordance with the invention generally relate to using signal feedback in communications devices to limit DC-offset and intermodulation distortion.

In some embodiments, a receiver arrangement includes a single ended multiband feedback amplifier, at least one single ended input, differential output mixer arrangement including a main mixer and a trim mixer, and a mixer feedback loop circuit configured to receive differential output signals generated by the mixer arrangement. The mixer feedback loop circuit generates a feedback signal based on the received differential output signals and provides the feedback signal to the mixer arrangement to minimize DC-offset and second order intermodulation products.

In accordance with an aspect of the invention, the single ended multiband amplifier may include an input stage, an output stage and a feedback net between the input and output stages. The input and output stages may be formed by any of a number of types of switching devices. For example, the input stage may be configured using transistors in a cascode arrangement, and the feedback net includes a configurable resistive and capacitive network to shape the frequency response of a feedback loop.

In another aspect of the invention, the single ended multiband feedback amplifier may include a programmable resonance tank circuit connected to an output stage of the amplifier. The resonant frequency of the programmable resonance tank circuit may be set based on a frequency band received at an input stage of the amplifier, and may be tuned to suppress downconverting noise from harmonics of an LO-frequency.

In yet another aspect, the main mixer and trim mixer of the mixer arrangement may respectively include a first transistor pair and a second transistor pair. The first transistor pair may include inputs that are DC-coupled to respective differential inputs of a balanced signal pair generated by a signal generator, and the second transistor pair may include inputs that are AC-coupled to the respective differential inputs of the balanced signal pair.

According to other aspects, the mixer feedback loop circuit may include a first stage having a low pass characteristic for receiving the differential output signals, and a second transconductance stage that outputs the feedback signal to the trim mixer of the mixer arrangement.

According to another aspect of the invention, an off-chip surface acoustic wave (SAW) band pass filter may be eliminated from transceiver architecture.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention. In the drawings.

DETAILED DESCRIPTION

Figure 1:
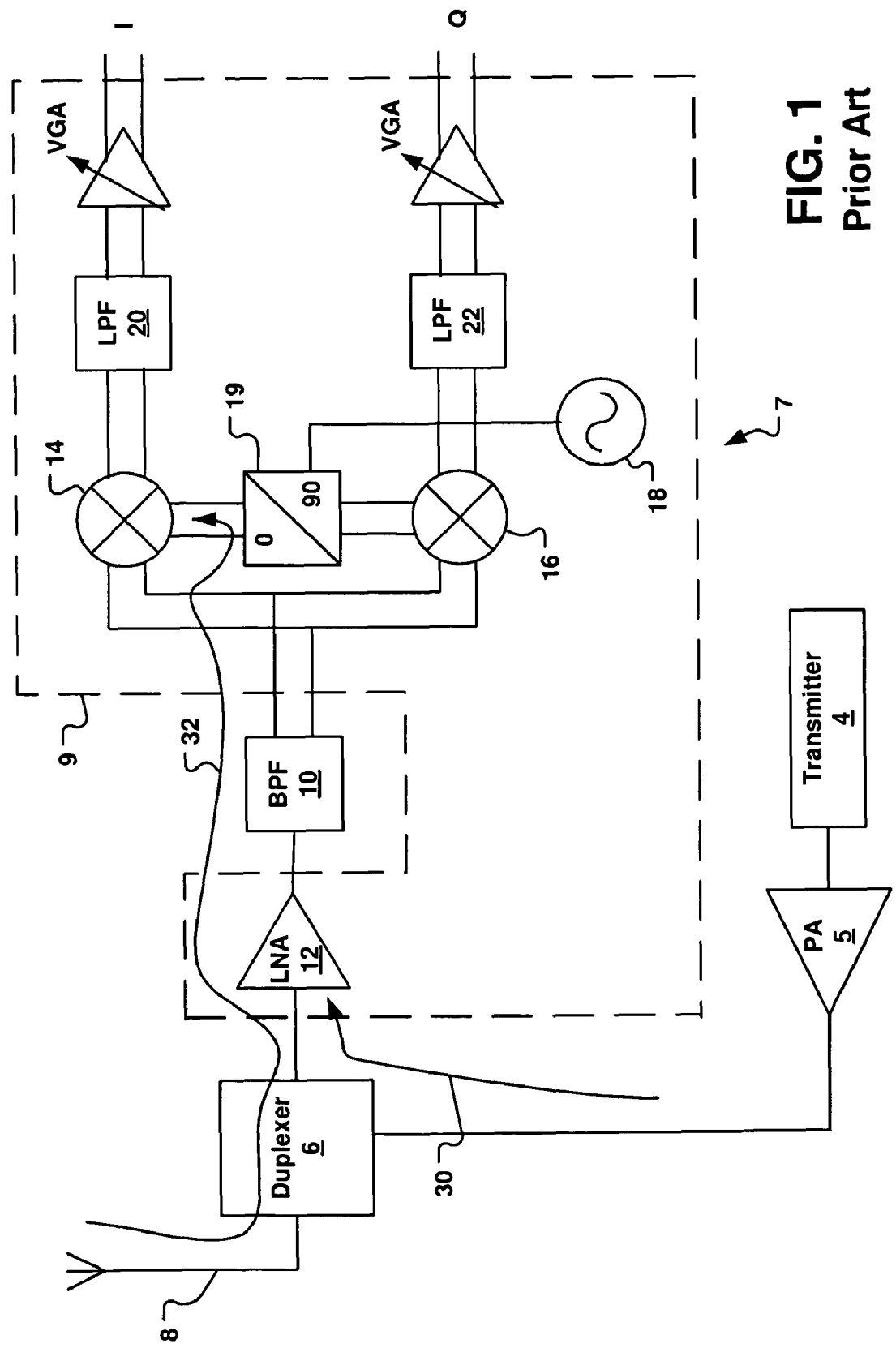
FIG. 1 is an illustration of conventional RF transceiver architecture.

The various aspects are described hereafter in greater detail in connection with a number of exemplary embodiments to facilitate an understanding of the invention. However, the invention should not be construed as being limited to these embodiments. Rather, these embodiments are provided so that the disclosure will be thorough and complete, and will fully convey the scope of the invention to those skilled in the art.

Furthermore, it should be emphasized that the terms "comprises" and "comprising," when used in this specification, are taken to specify the presence of stated features, integers, steps or components; but the use of these terms does not preclude the presence or addition of one or more other features, integers, steps, components or groups thereof.

According to embodiments of the invention, the second and third order linearity of a receiver including a low noise linear single ended multiband feedback RF amplifier plus a feedback mixer with IM2 suppression and DC-offset cancellation is high enough that it is no longer necessary to provide a SAW filter between the LNA and mixer. Eliminating SAW filter devices reduces costs and saves PCB area. Additionally, the compression point of the RF-amplifier and mixer is high enough that the TX-leakage signal into the LNA does not drive the receiver into compression.

Receiver architecture according to embodiments includes a single ended LNA followed by a single ended mixer without any SAW filter between the LNA and mixer. Because excluding the SAW filter puts very hard requirements on the third order linearity of the RF-amplifier and mixer, some embodiments described herein include a novel single ended multiband SAW-less LNA and mixer architecture. This LNA and mixer architecture has sufficiently high second and third order linearity to prevent TX-leakage from affecting receiver performance.

The invention significantly reduces second order intermodulation products in a single ended solution. A method described herein increases the second order linearity of the LNA and mixer without being forced to have a differential LNA and mixer. A balun between a single ended LNA and a differential mixer requires more die area than the presented solution with a multiband RF-amplifier using only one inductor. The area reduction is even larger if several baluns would be needed for multiband operation.

The invention provides improved noise figure in a single ended mixer. For instance, single ended mixers have the drawback compared with differential mixers in that they do not suppress noise from the LO-driver. To compensate for this architectural difference, an RF-amplifier described herein has a built-in attenuation for noise at harmonics to the LO-frequency since the gain of the disclosed RF amplifier has a very steep roll-off. Because all mixers downconvert noise from odd harmonics of the LO frequency, $f_{LO}$, reducing the contribution from these higher harmonics significantly lowers the noise figure of the mixer.

The invention provides for reduced size of off-chip capacitors. For example, the disclosed mixer includes off-chip capacitors for low-pass filtering in the feedback loop. The low pass characteristic of the feedback results in a high pass characteristic of the mixer output. The high pass cut-off frequency of the mixer conversion gain should be as low as possible not to cause increased bit-error rate. This is achieved by the disclosed mixer architecture having different tail currents in a trim mixer and a main mixer of a mixer core. As will be described herein in detail, the trim mixer and main mixer of each mixer core includes switching devices that share the same load at the mixer output, and control of the trim mixer switching devices is regulated by a feedback mechanism that minimizes DC-offset at the output.

When the transmitter output power is low, the IM2 products generated are very much reduced since they are proportional to the square of the TX output power. The disclosure describes a method to reduce the current consumption of the mixer when the TX output power is low.

The invention eliminates the need for production trimming of $2^{nd}$ order intercept point (IP$_2$). While IP$_2$ issues may be addressed by production tuning of the mixer load resistors, where a method involves supplying a test-tone to the receiver and the mixer load resistors are tuned using programmable switches in series with the load resistors until the second order distortion is minimized, such methods are less desirable because they add significant test time. Rather than production trimming, methods described herein reduce the effect of the device mismatch in a switching mixer core using a feedback loop.

Figure 2:
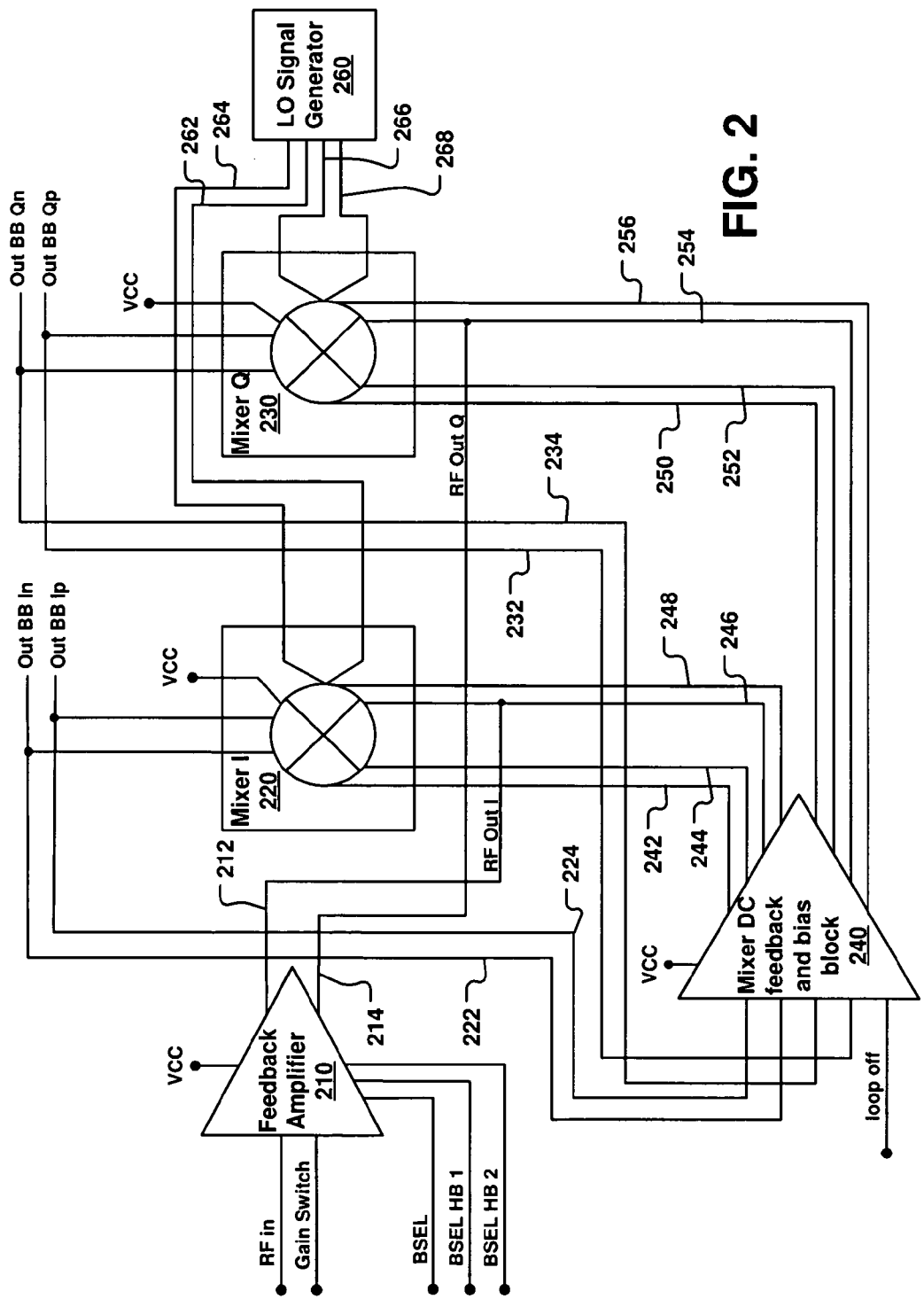
FIG. 2 is a diagram of a feedback amplifier and feedback mixer architecture according to some exemplary embodiments.

FIG. 2 shows a single ended multiband feedback RF amplifier and feedback mixer architecture in accordance with some embodiments. The presented architecture has high enough second and third order linearity that a SAW-filter is not needed between an LNA (not shown) and the I Mixer 220 and Q Mixer 230. The second-order linearity is achieved by a Mixer DC feedback and bias block 240. The feedback also strongly attenuates the DC-offset at the mixer output, and the third order linearity is guaranteed by a feedback RF amplifier 210.

The design of the architecture shown in FIG. 2 is all single ended. A single ended LNA (not shown) generates an RF-current, which is provided to the RF in terminal of the single ended multiband RF Feedback Amplifier 210. The RF Feedback Amplifier 210 generates one output current along path 212 for Mixer I 220, the I-channel mixer, and one output current along path 214 to Mixer Q 230, the Q-channel mixer. The Mixer I 220 and Mixer Q 230 are single ended, i.e. the RF-input signal is unbalanced. The two output currents of the Feedback Amplifier 210 are in phase.

Each of the Mixer I 220 and Mixer Q 230 includes a trim mixer and a main mixer, which will be described later in detail. The two outputs from the Mixer I 220 and the two outputs from the Mixer Q 230 are connected to the input of the Mixer DC feedback and bias block 240 along respective feedback path pairs 222/224 and 232/234. These feedback path pairs 222/224 and 232/234 are part of a mixer feedback loop including the mixer DC feedback and bias block 240 and its outputs 242 to 256, which provide bias and feedback currents to the mixers Mixer I 220 and Mixer Q 230.

The mixer DC-feedback and bias block 240 outputs currents $I_{trim\ left\ I}$ along path 242, $I_{trim\ right\ I}$ along path 244, $I_{tail\ main\ I}$ along path 246, $I_{tail\ trim\ I}$ along path 248, which are provided to the Mixer I 220, and $I_{trim\ left\ Q}$ along path 250, $I_{trim\ right\ Q}$ along path 252, $I_{tail\ main\ Q}$ along path 254 and $I_{tail\ trim\ Q}$ along path 256, which are provided to the Mixer Q 230. The in-phase (I) output of the Feedback Amplifier 210, RF Out I, is provided along path 212 to feedback path 246, and the quadrature (Q) output of the Feedback Amplifier 210, RF Out Q, is provided along path 214 to feedback path 254.

The LO Signal Generator 260 includes a LO-driver circuit that generates a balanced LO—output comprising four LO-signals: LO I n 262, LO I p 264, LO Q p 266 and LO Q n 268. The LO I n 262 and LO I p 264 signal pair are provided to the Mixer I 220, and the LO Q p 266 and LO Q n 268 signal pair are provided to the Mixer Q 230. The LO Signal Generator 260 may be a standard IQ divider circuit, although other types of local oscillator signal generating device may be used.

Details of an exemplary multiband programmable current-to-current RF Feedback Amplifier 210 will now be described with reference to FIG. 3. The multiband receiver may include multiple LNA's supplying RF-signals to the disclosed multiband RF Feedback Amplifier 210. The design targets of the RF Feedback Amplifier 210 are high third order linearity, low noise figure, and/or attenuation of the output noise at harmonics to the LO-frequency to thereby minimize noise originating from these harmonic frequencies that is downconverted by the mixers.

The current-to-current Feedback Amplifier 210 has a low input impedance. Therefore, the design of the LNA may be simplified because there would be no need for a cascode stage following the input transistor. A conventional design would typically include a cascode LNA input stage connected to a transconductance amplifier that generates the current for the mixer core. Seen from the output of the RF input transistor, the cascode device has a low input impedance. Consequently, the bandwidth of the LNA is increased because it is no longer limited by the RC-load generated by the load of the input transistor and its parasitic capacitance.

Figure 3:
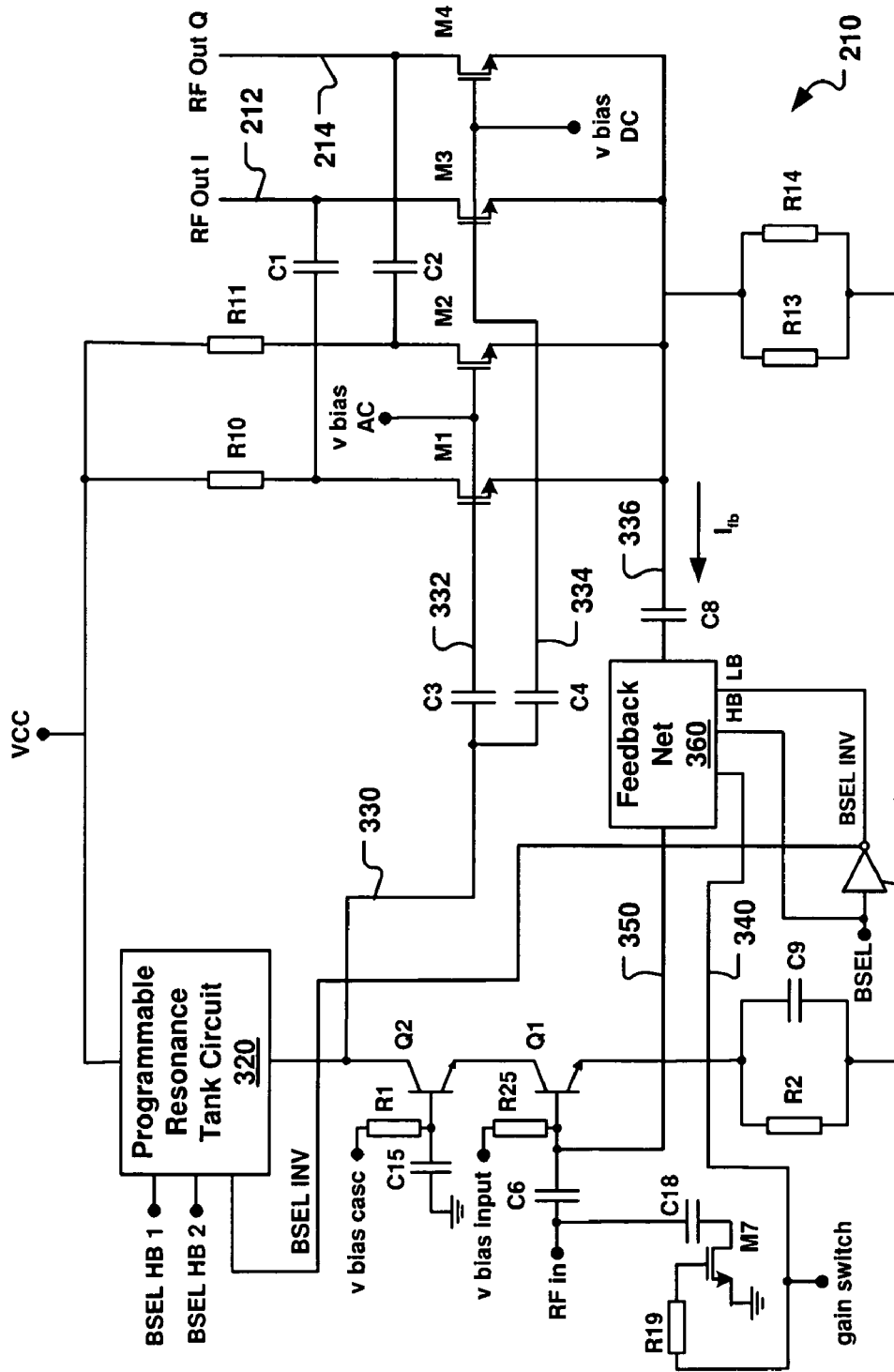
FIG. 3 is a diagram of a feedback amplifier according to an exemplary embodiment.

With reference to FIG. 3, the output signal from an ideal LNA, RF in, is provided to the base of a bipolar device Q1, which is part of a cascode configuration including bipolar device Q2. The emitter of Q1 is connected through the resistor R2 to ground for bias stability purposes. Since it is desired to have a low input impedance looking into the RF Feedback Amplifier 210, a capacitor C9 is provided across the resistor R2, thereby creating a low impedance from the emitter of Q1 for RF frequencies. The collector of Q1 is connected to the emitter of the cascode device Q2 which has a signal grounded base. The cascode configuration of transistors Q1 and Q2 is provided to increase the loop gain of the Feedback Amplifier 210. The loop gain, Aβ, directly determines the third order nonlinearity of the design. The collector of Q2 is connected to a Programmable Resonance Tank Circuit 320.

The resonance frequency of the Programmable Resonance Tank Circuit 320 is programmable, based on a logic level applied to band select inputs BSEL, BSEL HB 1, and BSEL HB 2, to increase, boost or maximize the loopgain for the desired band. Additionally, an inverted form of BSEL, BSEL INV, is created using an inversion device such as inverter 324, which may be formed using CMOS devices and configurations, or some other type of inverter. It will be appreciated that although the devices used in the exemplary cascode configuration of FIG. 3 are bipolar junction transistors (BJTs), other switching devices may be used. For instance, MOSFET devices may alternatively be used as devices Q1 and Q2, where a BJT common base stage (Q2) is replaced with a common gate stage, and the BJT common emitter stage (Q1) is replaced with a common source stage.

Figure 4:
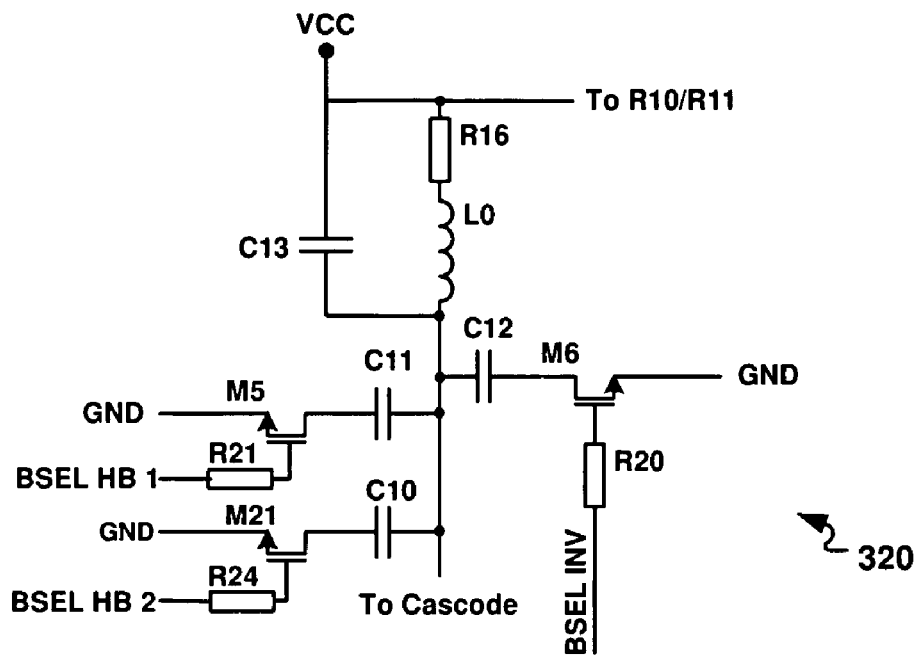
FIG. 4 is a schematic diagram of a programmable resonant tank circuit in accordance with an exemplary embodiment.

FIG. 4 shows more details of an exemplary Programmable Resonance Tank Circuit 320 according to some embodiments. The tank circuit consists of the on-chip inductor L0 and the fixed capacitor C13 together with the switched capacitors C10, C11 and C12. The tank resonance frequency may be altered based on the received band by activating one or more of the NMOS switches M5, M6 and M21. For band I operation (2110-2170 MHz), none of the switches would be turned on. For band II (1930-1990 MHz), BSEL HB 1 would be high and M5 would conduct. For band III (1805-1880 MHz), BSEL HB 1 and BSEL HB 2 would be high, i.e. both M5 and M21 conduct. In low band, for band V (869-894 MHz) and band VI (875-885 MHz), BSEL would be set low and correspondingly BSEL INV would be high, and BSEL HB 1 and BSEL HB 2 would be set high. Accordingly, switches M5, M6 and M21 would be on. For band VIII (925-960 MHz), only BSEL would be high, and thus only M6 would be on.

It is assumed that the positive supply and ground are signal-wise equal, i.e. there is sufficient decoupling between the positive supply and ground. This is necessary for the use of NMOS switches connected to ground to tune the parallel resonance circuit. If PMOS devices are used instead of NMOS devices, the Q-value of the resonance circuit would suffer due to the larger $r_{on}$ of these devices. A larger PMOS device also would have deteriorated the performance because the parasitic capacitor for the PMOS switch in its off-position would have been too large; thereby making it difficult to reach the highest needed resonance frequencies.

Returning to FIG. 3, the output from the Programmable Resonance Tank Circuit 320 is AC-coupled to the gates of the NMOS-devices M1 and M2 along paths 330, 332 and capacitor C3, and also AC-coupled to the NMOS devices M3 and M4 along paths 330, 334 and capacitor C4. The AC-coupling is needed because the DC-voltage at the output of the Programmable Resonance Tank Circuit 320 is not correct for an optimum size and/or DC-current of the NMOS devices M1 to M4. NMOS devices M3 and M4 are turned on via application of v bias AC, and NMOS devices M1 and M2 are turned on via application of v bias DC, based on whether the output to the mixer core should be DC-coupled or AC-coupled.

An interferer containing AM-modulation will generate a low frequency IM2 tone in the transconductance NMOS devices M1, M2, M3 and M4. If the AM-modulated interferer is represented by two frequencies, $f_1$ and $f_2$, the IM2 tone will be at frequency $f_1-f_2$.

If a mixer core is ideal, i.e., without mismatch, the IM2 tone would not reach the mixer's output. However, a mixer core having mismatch suffers from feed through of the low frequency signals. Thus, an IM2 tone will reach the mixer output based on the mismatch in the mixer core. In the AC-coupled mode in which the NMOS transistors M1 and M2 are turned on, an IM2 tone would be prevented from reaching the mixer core, Mixer I 220 or Mixer Q 230, by the AC-coupling of the output from the current-to-current Feedback Amplifier 210, which has a high-pass characteristic that would block a low frequency IM2 tone. The penalty for the AC-coupling is current consumption because the DC-current of the AC-coupled transconductance NMOS M1 and M2 is duplicated for the mixer switching core.

The Mixer DC feedback and bias block 240 is not capable of suppressing any low frequency IM2 signals originating from the current-to-current Feedback Amplifier 210. The RF input signal is supplied to the trim mixer of the Mixer I 220/Q 230 core via AC coupling from the RF input of the main mixer of the Mixer I 220/Q 230. For the case of DC-coupling of the output from the current-to-current Feedback Amplifier 210, a low frequency IM2 signal from this stage would reach the main mixer but not the trim mixer. If mismatch is present in the main mixer, the mixer feedback loop would compensate the mismatch by offsetting the trim mixer. However, the feed through of the IM2 component through the main mixer would still be the same.

The current gain of the Feedback Amplifier 210 is given by $$A_I = \frac{I_{RF\ OUT\ I} + I_{RF\ OUT\ Q}}{I_{RF\ in}}$$

Provided that the signal loss in the high pass filter C3, C4 that constitutes the AC-coupling is negligible, the current gain would be the same in DC-coupled or AC-coupled mode.

Under the condition that the open loop gain is high the current gain of the feedback amplifier is given by $$A_I = 1 + \frac{|Z_2|}{|Z_1|}.$$

Figure 5:
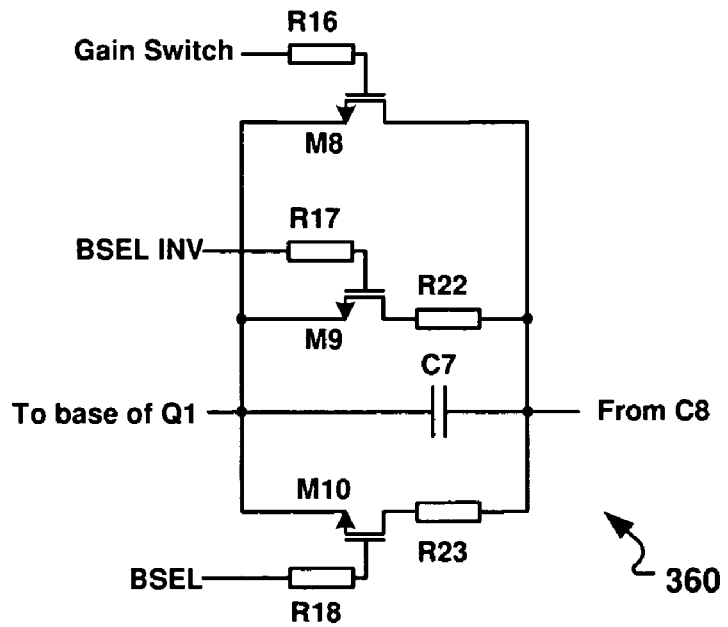
FIG. 5 shows an exemplary feedback net of a feedback amplifier in accordance with some exemplary embodiments.

The impedance $Z_1$ is the parallel connection of the resistors R13 and R14 connected from the source terminal of the NMOS-devices M1, M2, M3 and M4 to ground. The impedance $Z_2$ is frequency dependent and is changed when the receiver is programmed for low band (LB) or high band (HB) operation. For example, FIG. 5 shows details of an Feedback Net 360 according to some embodiments, which receives feedback current $I_{fb}$ along path 336 and sets either LB or HB operation by activating one of the NMOS switches M10 or M9 based on the BSEL input level to combine the capacitor C7 with either resistor R22 or resistor R23. The feedback path 350 from the Feedback Net 360 terminates at the base of transistor Q1. The shaping of the frequency response of the feedback loop is crucial for the performance of the Feedback Amplifier 210 as well as the overall performance of the Feedback Amplifier 210, Mixer I 220 and Mixer Q 230.

The loopgain of the Feedback Amplifier 210 is defined as $$Loopgain = A\beta = \frac{I_{RF\ in}}{I_{B,Q1}}$$

The "error current" in the feedback system is equal to the base current of input transistor Q1.

It is possible to achieve a higher open loop gain by replacing the LC-tank of the Programmable Resonance Tank Circuit 320 with a purely resistive load. However, the size of such a resistor would be limited by the maximum allowed DC voltage drop across it that would not forward bias the base-collector junction of transistor Q2. By contrast, there is no DC voltage drop with an LC-load. Since the open loop gain is higher, so is the closed loop gain, $A\beta$, thereby improving the third order linearity.

The mixer cores Mixer I 220 and Mixer Q 230 will down-convert noise from the RF Feedback Amplifier 210 not only at the LO-frequency but also at odd harmonics of the LO-frequency. For example, the Fourier series of a square wave LO-signal contains only odd harmonics i.e. frequencies $f_{LP}$, $3f_{LO}$, $5f_{LO}$ ... $(2n+1)f_{LO}$. The contribution to the total noise figure from these higher harmonics would be significant, especially from the $3f_{LO}$ frequency. To reduce the noise figure of the amplifier and mixers, it is important to reduce the mixer down conversion of noise at higher harmonics. The resonance of the Programmable Resonance Tank Circuit 320 of the RF Feedback Amplifier 210 is tuned to the LO-frequency. Far out from the LO-frequency, i.e. at higher harmonics, the resonance tank circuit will act as a shortcut to signal ground. As a result, the output noise from the RF Feedback Amplifier 210 will be heavily attenuated. Closer to the resonance frequency, typically for the third harmonic of the LO-frequency, the amplifier still has a high open loop gain and the frequency response is determined by the Feedback Net 360. There is a trade-off between constant gain within the band and a steep roll-off for higher frequencies. The disclosed Feedback Net 360 with a band dependent pole defined by capacitor C7 and either R22 or R23 solves this issue.

The LC-tank of the Programmable Resonance Tank Circuit 320 also improves the blocking performance of the RF Feedback Amplifier 210 and mixer. For frequencies close to the wanted signal for which the loopgain $A\beta$ is large, the two-stage amplifier of the RF Feedback Amplifier 210 will behave as a regular feedback current amplifier. For frequencies far away from the resonance frequency, the open loop gain of the RF Feedback Amplifier 210 vanishes and any possible interferer will be short circuited to VCC.

All four NMOS-devices M1, M2, M3 and M4 share the same feedback loop. The feedback signal is connected to the base of the input bipolar device through an AC-coupling via capacitor C8. The AC-coupling is required because the source potential of the NMOS-devices is too low to be directly connected to the base of the bipolar input device.

The maximum power of the WCDMA wanted signal is –25 dBm. In order not to compress the mixer feedback loop with the wanted signal, a gain switch may be implemented in the RF Feedback Amplifier 210. FIG. 3 shows a gain switch signal provided to the gate of an NMOS device M7 in series with a capacitor C18 connected to node RF in, and FIG. 5 shows an NMOS device M8 connected across the Feedback Net 360. When the gain switch signal is active or high, both M7 and M8 along path 340 would turn on, and the gain of the RF Feedback Amplifier 210 would reduce to 0 dB and the gain would further be reduced by shunting the RF input signal to ground through M7 and C 18.

While the LNA is not a detailed part of this disclosure, for purposes of analysis the LNA may be represented by an ideal voltage controlled current source. A 50-ohm input port may be loaded with a noiseless 50-ohm resistor to emulate the input matching. The resistive load of the LNA also may be represented by a noiseless resistor. A reasonable noise figure of the LNA is 1.0 dB. The $3^{rd}$ order intercept point (IP$_3$) of the LNA required to achieve, for example, a 32 dB voltage gain is assumed to be 0 dBm for the half-duplex test case. For in-band interferers, the linearity is a few dB worse. Since the input impedance of the RF feedback amplifier is low, there is no need for a cascode LNA input stage. Eliminating the common-base device saves voltage headroom in the LNA. The load resistor can therefore be increased resulting in that all LNA output signal current goes into the low impedance RF feedback amplifier.

If the receiver supports more than one band, the outputs of several different LNA's all may be connected to the same node, i.e., the RF input RF in of the current-to-current Feedback Amplifier 210. The active part of the LNA may be implemented using only one active device, although the LNA(s) may comprise more than one active device.

Figure 6:
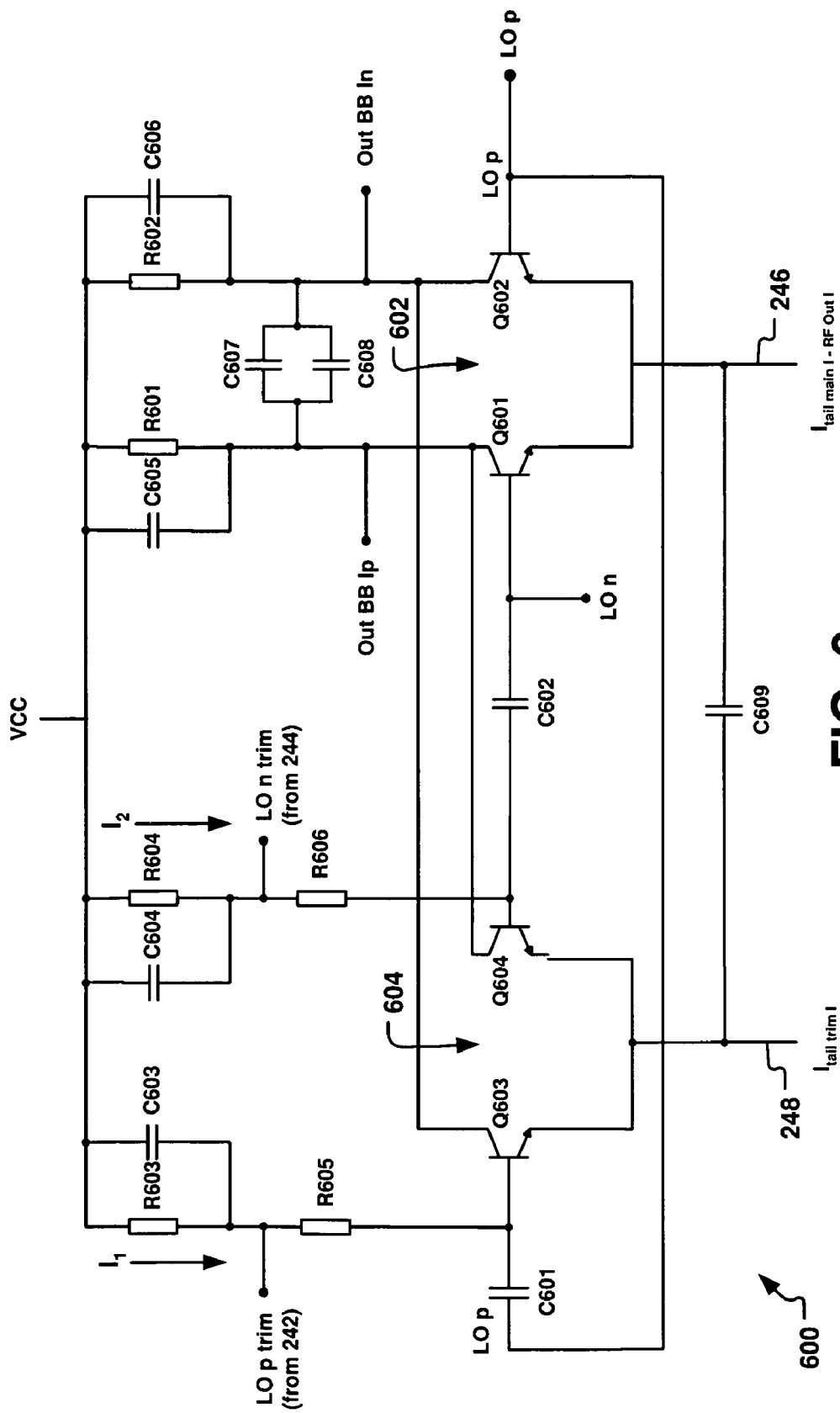
FIG. 6 illustrates an exemplary mixer circuit in accordance with some embodiments.

FIG. 6 shows details of a switching mixer core 600 that may be implemented as the Mixer I 220 in some embodiments, although it will be understood that Mixer Q 230 may be implemented in an identical or similar manner. The switching mixer core 600 includes a main mixer 602, which has transistors Q601 and Q602 and is DC-coupled to a LO-driver circuit (described later in detail). The switching mixer core 600 also includes a trim mixer 604, which has transistors Q603 and Q604 and is AC-coupled to the LO-driver circuit via capacitors C601 and C602. Connected together as depicted in FIG. 6, the main mixer 602 and the trim mixer 604 form the mismatch compensated switching mixer core of the Mixer I 220. It will be understood that a similar configuration having a phase shifted LO input forms the mismatch compensated switching mixer core of the Mixer Q 230.

The main mixer 602 and the trim mixer 604 share the same collector load including resistors R601 and R602 together with the capacitors C605, C606, C607 and C608. Capacitors C605 and C606 filter common mode signals, while C607 and C608 filter differential signals. A WCDMA TX-signal that leaks into the receive LNA through the finite isolation of a duplexer will be downconverted to an IF-frequency by the RX LO-signal. In the WCDMA high bands, the duplex distance is 190 MHz in band I, 85 MHz in band II, and 90 MHz in band III. In the low bands, i.e. band V, VI, and VIII, the duplex distance is 45 MHz. When transmitting at high power, this TX-leakage signal is the strongest interferer that the receiver must be able to handle without compressing. The filter at the mixer output will attenuate the IF-frequency so that the mixer feedback loop does not compress even while transmitting at maximum power.

The base bias voltages of the trim mixer are determined by the current I1 in the resistor R603 and current I2 in resistor R604. The mixer feedback loop will regulate these two currents so that the DC-offset at the mixer output becomes 0V, i.e. $V_{Out\ BB\ Ip} = V_{Out\ BB\ In}$. The capacitors C603 and C604 attenuate the LO voltage swing at nodes LO p trim and LO n trim. Without these capacitors, unwanted modulation of the output current from the mixer feedback circuit would occur. The resistors R605 and R606 isolate the LO-signal from the signal ground generated by capacitors C603 and C604. The input signal to the mixer feedback loop is mixer output voltages $V_{Out\ BB\ Ip}$ and $V_{Out\ BB\ In}$. The RF signal RF Out I from the current-to-current Feedback Amplifier 210 is supplied on path 212, which connects to path 246. A current $I_{tail\ main\text{-}RF\ Out\ I}$, which is based on the main tail current $I_{tail\ main\ I}$ generated in the Mixer DC feedback and bias block 240 and the amplifier output RF Out I, is present at the node common to the emitters of transistors Q601 and Q602. In order to have different DC tail currents in the main mixer 602 and the trim mixer 604, the RF signal on the path 246 is AC-coupled with capacitor C609 to a node common to the emitters of transistors Q603 and Q604 on path 248 where a tail trim current $I_{tail\ trim\ I}$, also generated in the Mixer DC feedback and bias lock 240, is present. For optimal operation, the ratio of the DC tail currents $I_{tail\ main\ I}$ and $I_{tail\ trim\ I}$ would typically be around 10.

For high IM2 suppression, all component mismatches besides mismatch in the switching devices of the switching mixer core 600 should be minimized. For example, if the load resistors R601 and R602 of the main mixer 602 are mismatched, the mixer feedback loop will try to compensate the DC-offset generated by this mismatch. However, the loop would then create a DC-offset between the bases of transistors Q603, Q604 in the trim mixer 604. This would then generate a poor IM2 performance in the compensated main mixer 602 due to $V_{be}$ mismatch, but there will still be an IM2 component originating from any mismatch in load resistors R601, R602. It is not possible to reduce the total IM2 distortion by compensating resistor load mismatch with $V_{be}$ mismatch in the mixer core. The mixer load resistors R601, R602 must therefore be scaled up until the IM2 contribution from their mismatch becomes negligible in comparison with the mismatch of the active switching devices Q603, Q604 of the switching mixer core 600. The same applies to the resistors R603 and R604 that set the potential of the bases of transistor Q603, Q604 in the trim mixer 604.

Upscaling of the active devices in the switching mixer core 600 is only possible to some amount. The upper size limit would be set by the switching speed requirement for high linearity. Too large devices may increase the capacitive load of the LO-driver of the LO Signal Generator 260 and therefore also increase current consumption of this driver.

The devices Q603 and Q604 in the trim mixer 604 may be mismatched. In the case of mismatch, the mixer feedback loop will compensate the DC-offset voltage at the output Out BB Ip and Out BB In of the switching mixer core 600 originating from this mismatch. The increased LO-leakage at the node receiving $I_{tail\ trim\ I}$ from this mismatch will be counteracted by the mixer feedback loop.

Figure 7:
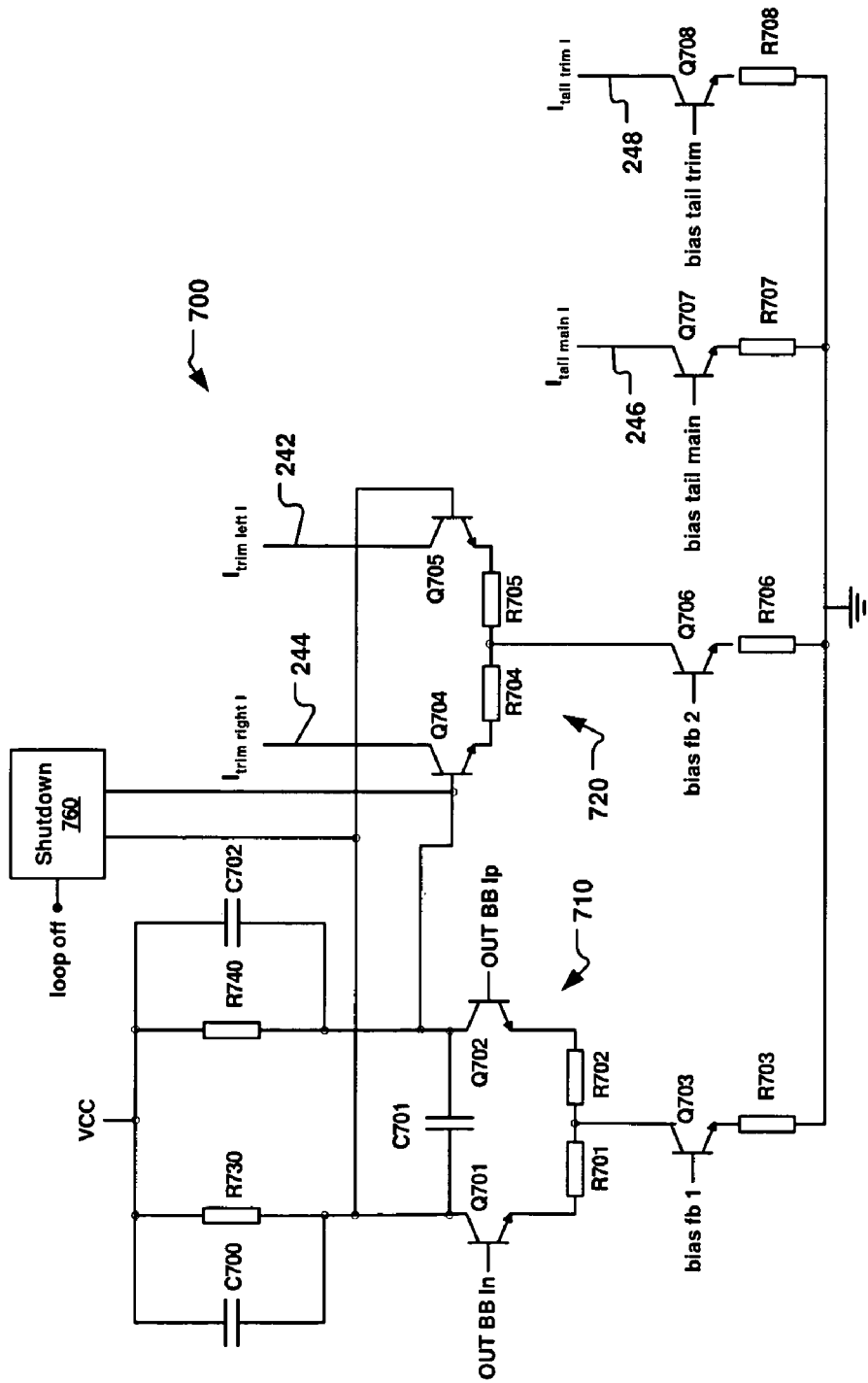
FIG. 7 is a schematic diagram of a mixer DC feedback and bias block in accordance with some embodiments.

FIG. 7 is a diagram of a mixer feedback loop circuit 700 that may be implemented in the mixer DC feedback and bias block 240 according to some embodiments. The mixer feedback loop circuit 700 acts on DC-offset that may be present at the outputs of Mixer I 220. While an identical arrangement would be provided for acting on DC-offset present at the outputs of Mixer Q 230, for brevity the details of this circuit are not provided. The mixer feedback loop circuit 700 includes a two-stage design that includes a low pass filter architecture implemented in a first stage 710 and a second stage 720 that operates as a transconductance. The second stage generates the feedback currents $I_{trim\ left\ I}$ and $I_{trim\ right\ I}$, which are respectively provided to the nodes LO p trim and LO n trim of the trim mixer 604.

In the mixer feedback loop circuit 700, the outputs Out BB In and Out BB Ip from the I-channel mixer are respectively connected to the base terminals of Q701 and Q702. Transistor Q703 and resistor R703 generate current at the common emitter node between the resistors R701 and R702. The low pass filter has both common-mode filtering with capacitors C700 and C702, and differential mode filtering by capacitor C701. The cut-off frequency of the common-mode filter is not setting the overall filter cut-off frequency. Rather, this is set by the external differential capacitor C701. To minimize the required size of C701, the resistive load may be made large. For example, the resistive loads R730 and R740 may be comprised of resistive networks, each including several series-connected and/or interleaved resistors, a large number of resistors, large resistor structures etc.

To handle the DC voltage drop across the load without forward biasing the base-collector junction of Q701 and Q702, the bias current of the second stage may be made low. The second stage is degenerated with resistors R704 and R705 to increase the compression point. Transistor Q706 and resistor R706 generate current at a common emitter node between the resistors R704 and R705.

The mixer tail currents $I_{tail\ main\ I}$ and $I_{tail\ trim\ I}$ are respectively generated via transistor/resistor arrangements Q707 and resistor R707, and transistor Q708 and resistor R708.

The degeneration resistors R704 and R705 in the second stage 720 have two purposes. They (1) increase the input impedance of the second stage and (2) increase the compression point. If the input impedance of the second stage 720 is too low, the filter cut-off frequency is set by this impedance instead of the high resistive load of the first stage 710.

The mixer feedback loop circuit 700 is dimensioned to be able to handle a certain level of mismatch in the main mixer core without running into compression. When the loop compresses, one or two of the differential stages in the loop will generate an output signal that is independent of the input signal, i.e. the entire tail current runs through one of the branches in the differential stage. Both the low pass filter first stage 710 and the transconductance second stage 720 may be heavily degenerated with resistors to increase the compression point.

The mixer feedback loop circuit 700 is active for only low frequencies, for example, DC plus a few kilohertz. As with the switching mixer core 600, all mismatches in the mixer feedback loop circuit 700 should be minimized. Otherwise, the loop would adjust the output currents from the mixer feedback loop circuit 700, $I_{trim\ right\ I}$ and $I_{trim\ left\ I}$, so that the mixer DC-offset originating from mismatch in the feedback path would approach zero volts. In this scenario, the IM2 performance would be degraded because the base bias of the trim mixer 604 would become offset. The generated offset would then not be due to mixer core device mismatch (that might have been low), and the mixer core would be offsetted undesirably and thereby generate the IM2 product. Since the bandwidth of the mixer feedback loop circuit 700 should be as low as possible, there would be no penalty for increased capacitance due to upscaling of the devices in the loop circuit. This applies both to active and passive devices. The active devices in the mixer feedback loop circuit 700 are typically 10 times larger than devices of the switching mixer core 600.

The resulting LO-leakage at the node of the main mixer 602 receiving $I_{tail\ main\text{-}RF\ Out\ I}$ together with an AM-modulated interferer, for example, a WCDMA TX-signal, will generate an $IM_2$-signal in the main mixer 602 due to cross modulation. The modulation of the TX-signal will transfer on to the LO-leakage signal through cross modulation. The downconverted AM-modulated LO-leakage then generates a baseband frequency at the AM-modulation frequency.

If the device mismatch in the main mixer (or in the trim mixer) increases, the LO-leakage at the node receiving $I_{tail\ main\text{-}RF\ Out\ I}$ of the switching mixer core 600 will also increase if not compensated by the mixer feedback loop circuit 700. The mismatch between a bipolar device can either be expressed as a difference in saturation current, $I_s$, or as an equivalent difference in $V_{be}$ that creates the same mismatch as the $I_s$ mismatch. For comparison, a 5% $I_s$ mismatch corresponds to a 1.27 mV $V_{be}$ mismatch while 1% $I_s$ mismatch correspond to a 0.26 mV $V_{be}$ mismatch.

The capability of the mixer feedback loop circuit 700 to reduce the LO-leakage, as well as the IM2 product, may be evaluated by inserting a voltage source as $V_{be}$ mismatch between the emitter of the device Q601 and the node receiving $I_{tail\ main\text{-}RF\ Out\ I}$ of the switching mixer core 600. For positive values of the inserted voltage source, the voltage would be higher at the common node receiving $I_{tail\ main\ RF\ Out\ I}$ compared with the emitter of Q601. The mismatch will cause a DC-current imbalance and a LO-leakage imbalance between Q601 and Q602, and the differential LO-signals LO p and LO n no longer cancel each other at the node receiving $I_{tail\ main\text{-}RF\ Out\ I}$.

The DC-current mismatch will create a DC-voltage offset at the output of the switching mixer core that the mixer feedback loop circuit 700 will counteract and cancel by changing the feedback currents $I_{trim\ right\ I}$ and $I_{trim\ left\ I}$. The trim mixer 604 will thereby become offset by the now unequal base voltages $V_{b\_Q603}$ and $V_{b\_Q604}$. If the base of Q604 has higher potential than the base of Q603, a higher DC-current will flow in Q604 compared with Q603. The leakage from the AC-coupled LO signal to node I tail trim will increase. If the LO-leakage signal from the trim mixer is added to the LO-leakage from the main mixer in node $I_{tail\text{-}main\text{-}RF\ Out\ I}$, the level of the summed LO-leakage is strongly attenuated.

Figure 8B:
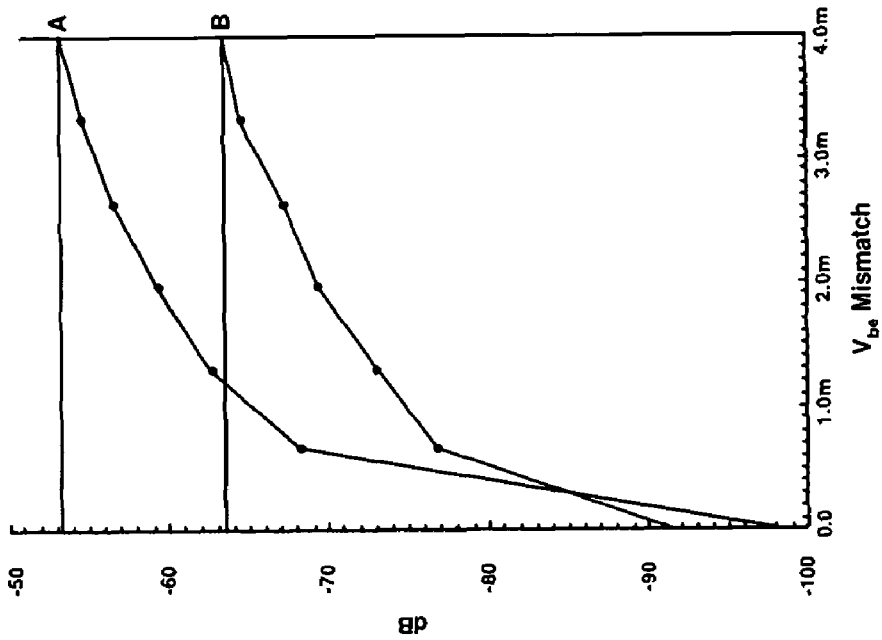
FIG. 8b is a graph illustrating the difference in LO-leakage level versus $V_{be}$ mismatch between a quadrature (Q) mixer with and without feedback enabled.
Figure 8A:
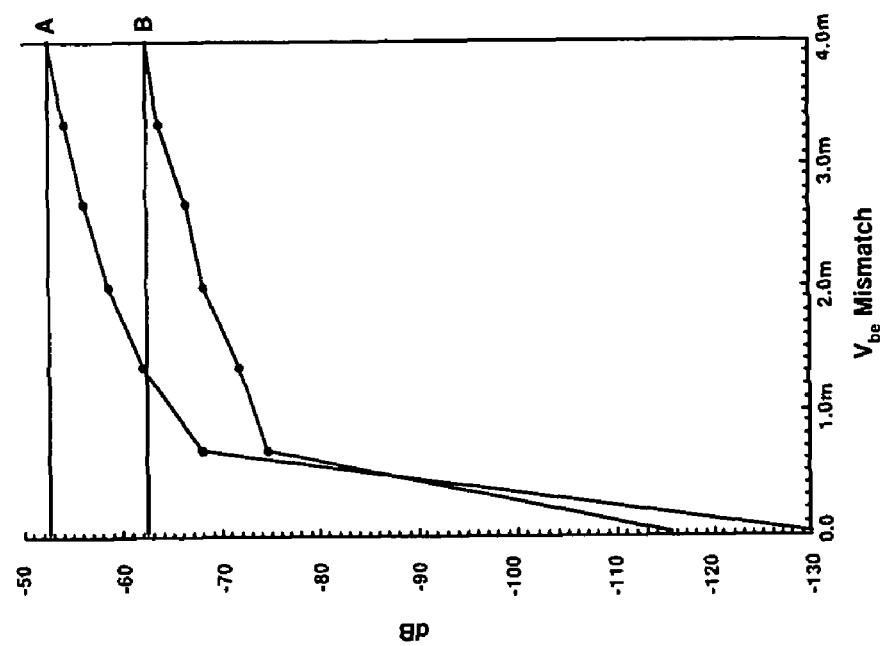
FIG. 8a is a graph illustrating the difference in LO-leakage level versus $V_{be}$ mismatch between an in-phase (I) mixer with and without feedback enabled.

FIGS. 8*a* and 8*b* are graphs illustrating the difference in LO-leakage level in dBV$_p$ at the node receiving $I_{tail\ trim\ RF\ Out\ I}$ versus $V_{be}$ mismatch between transistors Q601 and Q602 of the main mixer 602. FIG. 8*a* shows results for Mixer I 220 using feedback, "A," and without feedback, "B" (i.e., the feedback is disabled); and FIG. 8*b* similarly shows results for Mixer Q 230 using feedback, "A," and without feedback, "B." When, for a comparing simulation, the feedback loop was disabled. The LO-frequency is 2200 MHz. The attenuation of the LO-leakage is 10 dB with the mixer feedback loop circuit 700 turned on.

Another source of IM2 distortion is cross modulation from the AM-modulation of the TX-interferer transferring on to the LO-leakage at the input of the main mixer 602 and the trim mixer 604. Down conversion of the AM-modulated LO-leakage by the LO-signal itself will create a low frequency tone at the mixer output at the IM2 frequency. Compared with the IM2 components generated by the transconductance second order distortion and the self-mixing of the RF-signal in the mixer core, the cross modulation tone is a differential signal, i.e. the phase difference between the IM2 cross modulation collector currents in the left mixer transistor and right mixer transistor is 180 degrees. In linear scale, the IM2 cross modulation component is proportional to $V_{LO\_leak}/IP_3^2$ where $V_{LO\_leak}$ is the LO-leakage level at the mixer input.

Figure 9A:
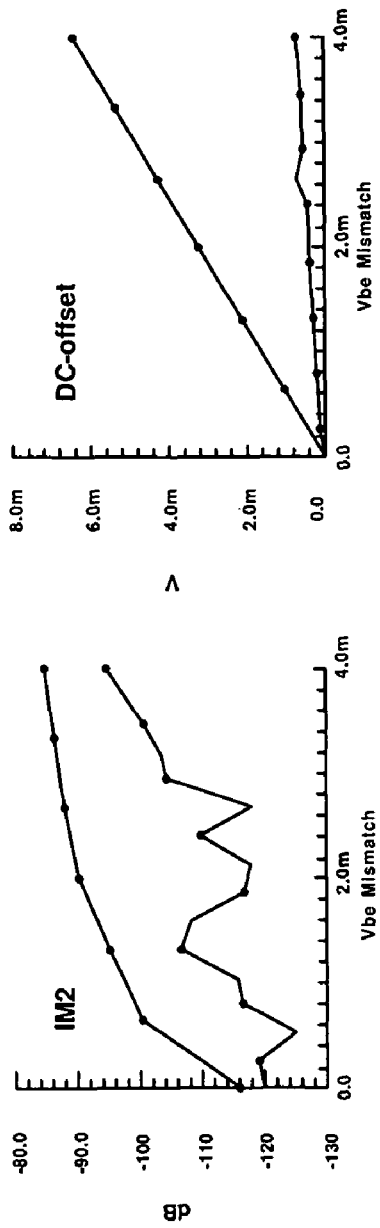
FIG. 9a is a graph showing the IM2 level and DC-offset versus $V_{be}$ mismatch with and without mixer feedback for I mixer.
Figure 9B:
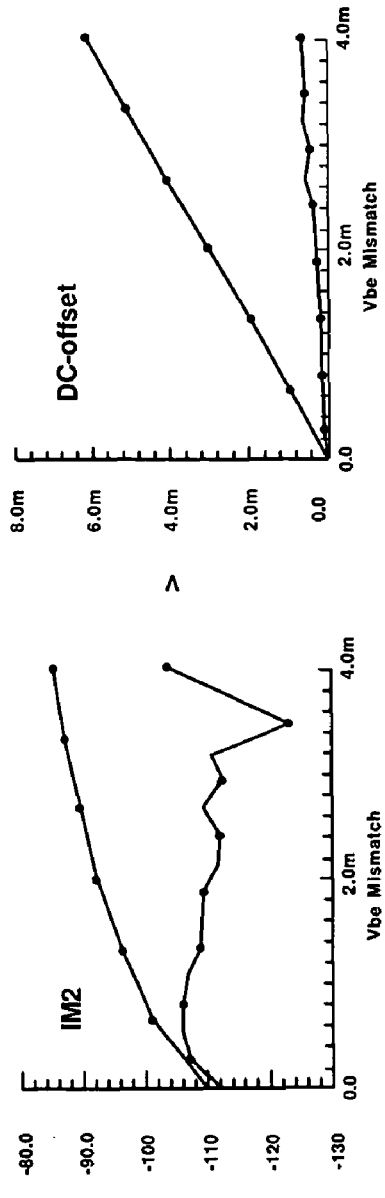
FIG. 9b is a graph showing the IM2 level and DC-offset versus $V_{be}$ mismatch with and without mixer feedback for Q mixer.

In case of mismatch in the main mixer 602, such as less DC-current in the left main mixer device including transistor Q601, the phase of the LO-leakage will be θ degrees at the input of the main mixer. Since the trim mixer 604 will counteract the DC-offset generated by the main mixer 602, the right device of the trim mixer (including transistor Q604) will have a higher DC-current. The LO-leakage at the input of the trim mixer 604 will therefore be at the phase θ+180 degrees. The generated IM2 cross modulation collector currents from the main mixer 602 and trim mixer 604 will therefore counteract each other. FIG. 9*a* shows results of the IM2 level in dBVP and DC-offset versus $V_{be}$ mismatch with and without feedback and DC-offset at the output of Mixer I 220, where the LO-frequency is 2200 MHz, the AM-modulated TX-interferer is represented by two interferers at 2000 MHz and 2000 MHz+30 kHz respectively, and the input power of both signals was −33 dBm at the LNA input. FIG. 9*b* shows the IM2 level and DC-offset versus $V_{be}$ mismatch using these same parameters, with and without feedback for Mixer Q230.

The baseband output signal of the switching mixer core 600 will have a high pass characteristic, i.e., the conversion gain for RF-frequencies very close to the LO-signal is reduced compared with the gain for RF-frequencies further away from the LO-signal. This is an unwanted feature of the invention since a WCDMA signal includes low frequency modulation. The reason for this is that the cut-off frequency for the low pass filter in the feedback loop is not infinitely low. Baseband frequencies below the low pass filter cut-off frequency will therefore be present at the bases of the trim mixer. Due to the finite rise time and fall time of the trim mixer, there is a certain feed through of low frequency signals from the base to the collector of the mixer trim devices. The collector signal current originating from low-frequency feed through will add in opposite phase to the baseband current created from down conversion of the RF-signal in the main mixer and the trim mixer.

The collector signal current of the trim mixer 604 originating from low-frequency feed through will depend on the tail current of the trim mixer. A smaller tail current in the trim mixer 604 results in less feed through. For a given pole location in the mixer feedback loop the high pass cut-off frequency is lowered for a smaller tail current of the trim mixer 604. The switching mixer core 600 therefore has the unique feature of reducing the needed capacitor size in the feedback loop for a given cut-off frequency. A solution based on only the trim mixer and no main mixer would require a significantly larger low pass filter capacitor.

Since the frequency response of the switching mixer core 600 has a high pass characteristic, the pole location of the mixer feedback loop circuit is critical. While a mixer feedback loop described herein has only one pole, a more complex feedback loop including more than one pole may be implemented. In a one-pole design, the required capacitor is typically intended to be placed off-chip, either on a laminate inside the package or on the PCB. Two capacitors are needed, one for the I-channel and one for the Q-channel. The required pole location for maintained bit error rate, BER, depends on the modulation scheme of the received signal. For example, WCDMA modulation with QPSK-modulation can tolerate a pole at 7 kHz, while WCDMA with 16-QAM modulation, i.e. HSDPA, requires a pole location lower than 1 kHz.

The loop gain of the switching mixer core 600 will vary with the baseband frequency. The loop gain at baseband frequency f will be the difference between the maximum conversion gain and the conversion gain at frequency f up to the high pass cut off frequency. For frequencies higher than the cut-off frequency of the low pass filter, the loop gain approaches 0 dB. The loop gain is largest at DC.

The embodiments with a trim mixer 604 have a base terminal AC-coupled to the base terminal of the main mixer 602 can suppress noise from the mixer feedback loop. The emitters of transistors Q603 and Q604 of the trim mixer 604 are AC-coupled to the emitters of transistors Q601 and Q602 of the main mixer 602. The output current signals from the mixer feedback loop circuit 700, $I_{trim\ left\ I}$ and $I_{trim\ right\ I}$, are connected to the bases of transistors Q603 and Q604 of the trim mixer 604. Accordingly, no low frequency noise from the mixer feedback loop circuit 700 can reach the bases of transistors Q601 and Q602 of the main mixer 602. The trim mixer 604, however, has a certain feed through of low frequency noise from the mixer feedback loop circuit 700, but since the tail current of the trim mixer 604 is only a fraction of the tail current in the main mixer 602, the contribution from the feedback loop noise to the overall noise figure is very much reduced. Hence, noise from the mixer feedback loop circuit 700 is suppressed with the trim mixer 602. If the relation between the two tail currents is altered so that a larger part of the total tail current goes through the trim mixer, the noise figure would increase.

Figure 10:
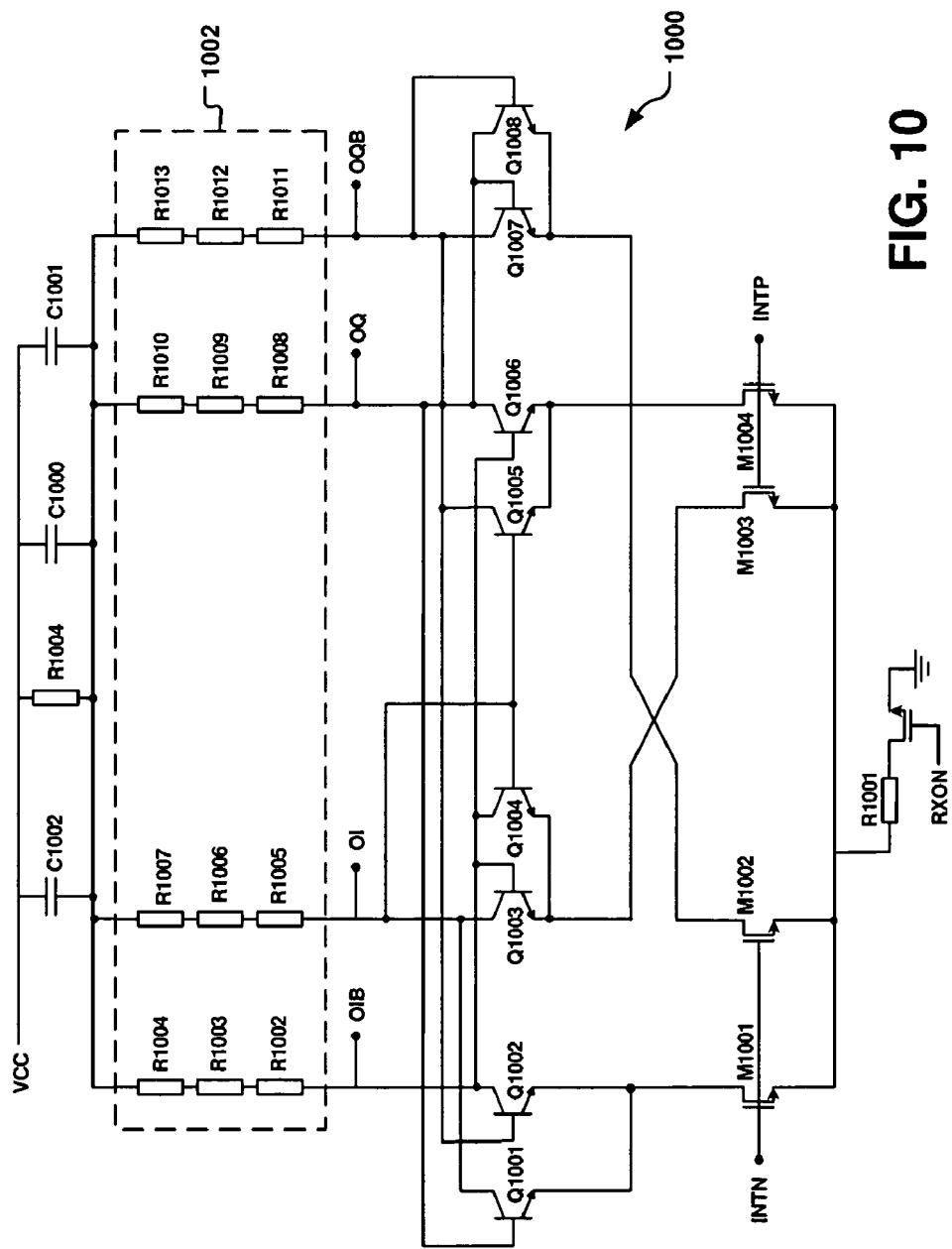
FIG. 10 is a schematic diagram of a LO-driver circuit according to some embodiments.

For the LO Signal Generator 260, the LO-signal to the Mixer I 220 and Mixer Q 230 may be provided through a standard IQ-divider circuit. FIG. 10 is an exemplary LO-driver circuit 1000. While the basic design of this driver circuit is not part of this disclosure, optimal IM2 performance of the switching mixer core 600 is not independent of this circuit.

To prevent IM2 performance degradation, the mixer should be provided with an LO-signal having a short rise time and short fall time. Additionally, the size of the resistor load should be scaled up to minimize mismatch. The same applies to the size of the devices in the circuit of the IQ-divider. Since this disclosure is a single ended design, the noise from the load resistor in the LO-driver is not suppressed in the mixer. To optimize the noise performance while still generating an LO signal with sufficient amplitude, the size of the load resistors was decreased and the tail current was increased. Since the size of the resistor load is large, the parasitic capacitance to ground of the resistor is increased. This deteriorates the shape of the LO waveform, i.e., the rise time and the fall time of the LO-pulses increases. FIG. 10 shows a bank of load resistances 1002, where each resistor load is split into three series connected resistors, R1002-R1004, R1005-R1007, R1008-1010, and R1011-1013. This split configuration reduces the impact of the parasitic capacitance, and thus improves LO-pulse rise and fall times.

The output DC-offset voltage from an active mixer also may be removed by a conventional high pass filter i.e. AC-coupling between the mixer load and the following stage. The requirements on the cut-off frequency and the resistive impedance in the mixer output node determine the necessary size of the capacitor. The size of the mixer load resistors is usually in the range of a few hundred ohms.

The cut-off frequency of the disclosed mixer is instead set by the low pass filter in the first stage 710 of the mixer feedback loop circuit 700. The required size of the filter capacitor C701 in the first stage is determined by the impedance of the parallel connection of the resistive load of the first stage and the input impedance of the second stage 710. This impedance is at least an order of magnitude larger than the mixer load impedance, and the size of the capacitor in the feedback path corresponding to the same cut-off frequency as for a conventional mixer with AC-coupling is therefore very much reduced.

The requirements on IP$_2$ and IP$_3$ are hardest when transceiver, for example, a mobile station, is transmitting at full TX-power. Conversely, these requirements on linearity are relaxed when the output power is low. This fact can be used to save current in the disclosed RF-amplifier and mixer by including a trim mixer and RF feedback amplifier AC-coupling shut down mode.

An AC-coupling shut down mode may operate as follows: The selected output power to the power amplifier (PA) would be known of the transceiver (e.g., a mobile transceiver). For a certain power level, a control signal may be sent to the RF Feedback Amplifier 210 to disable the NMOS devices M1 and M2 that are AC-coupled to the output. The AC-coupling blocks the low frequency IM2 product and only allows the high frequency RF signal to pass. The devices M3 and M4 that are DC-coupled to the output are then enabled. This is the current save mode. The DC-current in the output NMOS is reused as the mixer tail current.

When the mobile is transmitting at a low power (e.g., <<+24 dBm), the requirements on the mixer IP$_2$ is very much relaxed. If desired, the baseband frequency response of the mixer can be made flat from DC to the cut-off frequency defined by the mixer pole by shutting down the trim mixer 604. Shutdown is implemented by applying a loop off signal to the Shutdown component 760 to turn off the bias to the first stage 710 of the mixer feedback loop circuit 700. For example, the input to the second stage 720 of the mixer feedback loop circuit 700 may be biased using switches controlled by the loop off signal and connected to a voltage source. By turning off the mixer feedback loop circuit 700, the DC-offset compensation is also lost. Because there is no need for low second order distortion, the AC-coupling of the transconductance stage of the Feedback RF Amplifier 210 also may be turned off. This also saves a significant amount of DC-current. Thus, when the output power of the PA is a known parameter, it may be used to control a possible shutdown of the trim mixer 604 and the AC-coupling NMOS transistors M1 and M2 of the Feedback RF Amplifier 210.

If desired, the mixer feedback loop circuit 700 can be kept on while the AC-coupling of the transconductance in the RF Feedback Amplifier 210 is turned off. In this mode, the current saved may still be large because the current consumption of the mixer feedback loop circuit 700 would be negligible compared with the tail current of the mixer (the DC-current in the transconductance is the same as the mixer tail current). In this mode, the IM2 performance would be limited, but the mixer would still have low DC-offset.

The invention provides a multiband SAW-less single ended RF Feedback Amplifier and mixer with high enough second and third order linearity, which is functional in a communications system, such as a WCDMA system. The DC-offset at the mixer output is strongly attenuated which is beneficial for the following stages, for example, a baseband filter and analog-to-digital converter (ADC).

The LNA coupled to the RF Feedback Amplifier may be single ended, which facilitates a multiband solution because only one package pin would be required for each band.

Also, Q-value requirement for an on-chip inductor in the RF Feedback Amplifier is relaxed, and thus a rather low Q-value and therefore small inductor may be used. Compared with an on-chip balun in a design with a differential mixer and a single ended LNA, such an inductor would occupy significantly less area.

Additionally, because the programmable feedback RF amplifier is multiband, only one on-chip inductor may be needed in some embodiments.

According to embodiments, the gain of the RF Feedback Amplifier has flat gain within the band and a steep roll-off for higher frequencies. This improves the noise figure for the LNA and mixer since much less undesired signals would be downconverted by higher harmonics of the LO-frequency. This feature would be provided by implementations of the programmable resonance LC-tank circuit and the programmable feedback net described herein.

Also, the requirements for a filter capacitor in the mixer feedback loop for a certain high pass cut-off frequency would be significantly reduced due to the disclosed switching mixer core having much less tail current in its trim mixer compared with a tail current in its main mixer.

It will be apparent to those skilled in the art that various changes and modifications can be made in the method and system for limiting DC-Offset and intermodulation distortion of the present invention without departing from the spirit and scope thereof. Thus, it is intended that the invention cover the modifications of this invention provided they come within the scope of the appended claims and their equivalents.

What is claimed is:

1. A receiver arrangement, comprising:
a single ended multiband feedback amplifier;
at least one single ended input, differential output mixer arrangement comprising a main mixer and a trim mixer; and
a mixer feedback loop circuit configured to receive differential output signals generated by the mixer arrangement, generate a feedback signal based on the received differential output signals, and provide the feedback signal to the trim mixer of the mixer arrangement to thereby minimize DC-offset and second order intermodulation products,
wherein:
the main mixer comprises differential mixer circuitry having a pair of input nodes that are DC-coupled to respective differential inputs of a balanced signal pair generated by a signal generator, a second node connected to a common node and receiving a signal output from the single ended multiband feedback amplifier, and an output node that outputs the differential output signal; and
the trim mixer comprises differential mixer circuitry having a pair of input nodes that are AC-coupled to the respective differential inputs of the balanced signal pair, a second node connected to a common node, and an output node connected to the output node of the differential mixer circuitry of the main mixer;
wherein:
the common node of the main mixer and the common node of the trim mixer are AC-coupled with each other, and
the trim mixer receives the feedback signal from the mixer feedback loop circuit.

2. The receiver arrangement according to claim 1, wherein the single ended multiband feedback amplifier comprises:
an input stage, an output stage and a feedback net coupled between the input and output stages; and
a programmable resonance tank circuit connected to an output of the input stage, wherein the resonant frequency of the programmable resonance tank circuit is set based on a frequency band received at an input of the input stage.

3. The receiver arrangement according to claim 2, wherein the resonance tank is tuned at or near a local oscillator frequency to attenuate higher harmonics of the local oscillator frequency.

4. The receiver arrangement according to claim 2, wherein a portion of the current in the output stage is provided as feedback current to the input of the input stage through the feedback net.

5. The receiver arrangement according to claim 4, wherein the feedback net comprises frequency dependent, configurable resistive and capacitive network and shapes the frequency response of a feedback loop based on a band operation of the single ended multiband feedback amplifier.

6. The receiver arrangement according to claim 2, wherein the input stage is a cascode configuration.

7. The receiver arrangement of claim 1, further comprising a gain switch that, when enabled, reduces the gain of the single ended multiband feedback amplifier by shunting an input signal to the single ended multiband feedback amplifier to ground.

8. The receiver arrangement of claim 7, wherein the gain switch is enabled when the power of the input signal exceeds a predetermined level.

9. A receiver arrangement, comprising:
a single ended multiband feedback amplifier;
at least one single ended input, differential output mixer arrangement comprising a main mixer and a trim mixer; and
a mixer feedback loop circuit configured to receive differential output signals generated by the mixer arrangement, generate a feedback signal based on the received differential output signals, and provide the feedback signal to the mixer arrangement to thereby minimize DC-offset and second order intermodulation products,
wherein the single ended multiband feedback amplifier comprises:
an input stage, an output stage and a feedback net coupled between the input and output stages; and
a programmable resonance tank circuit connected to an output of the input stage, wherein the resonant frequency of the programmable resonance tank circuit is set based on a frequency band received at an input of the input stage, and
wherein the output stage comprises two pair of transistors, one pair transistor is coupled to an output node of the single ended multiband feedback amplifier through an AC coupled path and the other pair transistor through a DC coupled path, and wherein either the AC path or the DC path is selected based on an output power level of a power amplifier.

10. A receiver arrangement, comprising:
a single ended multiband feedback amplifier;
at least one single ended input, differential output mixer arrangement comprising a main mixer and a trim mixer; and
a mixer feedback loop circuit configured to receive differential output signals generated by the mixer arrangement, generate a feedback signal based on the received differential output signals, and provide the feedback signal to the mixer arrangement to thereby minimize DC-offset and second order intermodulation products,
wherein the main mixer comprises:
a first transistor pair, each transistor of said first pair comprising a first input node that is DC-coupled to respective differential inputs of a balanced signal pair generated by a signal generator, a second node connected with the second node of the other of the first pair of transistors to a common node and receiving a signal output from the single ended multiband feedback amplifier, and an output node that outputs the differential output signal; and
wherein the trim mixer comprises:
a second transistor pair, each transistor of said second pair comprising an input node that is AC-coupled to the respective differential inputs of the balanced signal pair, a second node connected with the second node of the other of the second pair of transistors to a common node, and an output node connected to the output node of the first transistor pair;
wherein the common nodes of the first and second transistor pairs are AC-coupled with each other, and wherein the trim mixer receive the feedback signal from the mixer feedback loop circuit.

11. A receiver arrangement, comprising:
a single ended multiband feedback amplifier;
at least one single ended input, differential output mixer arrangement comprising a main mixer and a trim mixer; and a mixer feedback loop circuit configured to receive differential output signals generated by the mixer arrangement, generate a feedback signal based on the received differential output signals, and provide the feedback signal to the mixer arrangement to thereby minimize DC-offset and second order intermodulation products, wherein the mixer feedback loop circuit comprises:

a first stage including a third transistor pair, each transistor of the third transistor pair including a first input node that receives a respective one of the differential output signals from the mixer arrangement, and an output node, wherein said first stage has a low pass filter characteristic; and a second transconductance stage including a fourth transistor pair, each transistor of the fourth transistor pair including an first input node connected to one of the output nodes of the third transistor pair, and an output node that outputs the feedback signal to the second transistor pair of the trim mixer to control bias voltages of the second transistor pair.

12. The receiver arrangement according to claim 11, wherein the output of each transistor of the third transistor pair is connected to an RC network.

13. The receiver arrangement according to claim 11, wherein a shutdown mechanism is provided in the mixer feedback loop circuit to turn off bias voltages to the third transistor pair.

14. The receiver arrangement according to claim 11, wherein the shutdown mechanism is activated when a transmitter associated with the receiver arrangement transmits below a predetermined power level.

* * * * *

UNITED STATES PATENT AND TRADEMARK OFFICE
CERTIFICATE OF CORRECTION

PATENT NO. : 8,149,955 B2
APPLICATION NO. : 12/164142
DATED : April 3, 2012
INVENTOR(S) : Tired It is certified that error appears in the above-identified patent and that said Letters Patent is hereby corrected as shown below:

In Column 2, Line 53, delete "IM$_2$" and insert -- IM2 --, therefor.

In Column 7, Line 31, delete "LO" and insert -- L0 --, therefor.

In Column 9, Line 23, delete "f$_{LP}$," and insert -- f$_{LO}$, --, therefor.

In Column 10, Line 57, delete "I1" and insert -- I$_1$ --, therefor.

In Column 10, Line 57, delete "I2" and insert -- I$_2$ --, therefor.

In Column 12, Line 57, delete "IM$_2$-signal" and insert -- IM2-signal --, therefor.

In Column 13, Line 65, delete "dBVP" and insert -- dBV$_P$ --, therefor.

Signed and Sealed this
Fifth Day of February, 2013

Teresa Stanek Rea
*Acting Director of the United States Patent and Trademark Office*